United States Patent
Wyland

(10) Patent No.: US 6,836,869 B1
(45) Date of Patent: Dec. 28, 2004

(54) COMBINED CYCLIC REDUNDANCY CHECK (CRC) AND REED-SOLOMON (RS) ERROR CHECKING UNIT

(75) Inventor: David C. Wyland, Morgan Hill, CA (US)

(73) Assignee: Cradle Technologies, Inc., Sunnyvale, CA (US)

(*) Notice: Subject to any disclaimer, the term of this patent is extended or adjusted under 35 U.S.C. 154(b) by 510 days.

(21) Appl. No.: 10/061,500

(22) Filed: Feb. 1, 2002

Related U.S. Application Data

(60) Provisional application No. 60/266,002, filed on Feb. 2, 2001.

(51) Int. Cl.[7] ............................................. H03M 13/15
(52) U.S. Cl. ..................................... 714/781; 714/784
(58) Field of Search ................................. 714/757, 774, 714/781, 784

(56) References Cited

U.S. PATENT DOCUMENTS

| | | | | |
|---|---|---|---|---|
| 3,678,469 A | * | 7/1972 | Freeman et al. ............ | 714/779 |
| 5,136,592 A | | 8/1992 | Weng ......................... | 371/39.1 |
| 5,375,127 A | | 12/1994 | Leak et al. ................. | 371/40.1 |
| 5,383,204 A | | 1/1995 | Gibbs et al. ............... | 371/37.7 |
| 5,615,221 A | * | 3/1997 | Karp et al. ................. | 714/752 |
| 5,671,237 A | | 9/1997 | Zook .......................... | 371/37.4 |
| 6,370,671 B1 | * | 4/2002 | Pan et al. ................... | 714/784 |
| 6,378,104 B1 | * | 4/2002 | Okita ......................... | 714/784 |
| 6,405,339 B1 | * | 6/2002 | Cox et al. ................... | 714/784 |
| 6,467,063 B1 | * | 10/2002 | Fukuoka ..................... | 714/784 |
| 6,754,870 B2 | * | 6/2004 | Yoshida et al. ............. | 714/758 |

* cited by examiner

*Primary Examiner*—Stephen M. Baker
(74) *Attorney, Agent, or Firm*—Schneck & Schneck; Thomas Schneck; Mark Protsik

(57) ABSTRACT

An error checking circuit that performs RS encoding and decoding operations and also generates CRC codes includes a configurable two-stage combinatorial circuit that carries out selected finite-field arithmetic operations associated with RS and CRC coding. Input registers store the generator polynomial and operand coefficients associated with the data blocks or packets being encoded or decoded, and an output register holds the intermediate working result and at the end the final result of the finite-field arithmetic operation. Each stage of the combinatorial circuit includes sets of AND and XOR gates performing bitwise finite-field multiply and add on the operand bits, and the connections between registers and gates and between gates in the two stages are configured by multiplexer units responsive to RS and CRC instructions. The two-stage combinatorial block can be replicated into a 4-stage or 8-stage arithmetic circuit for CRC mode.

11 Claims, 10 Drawing Sheets

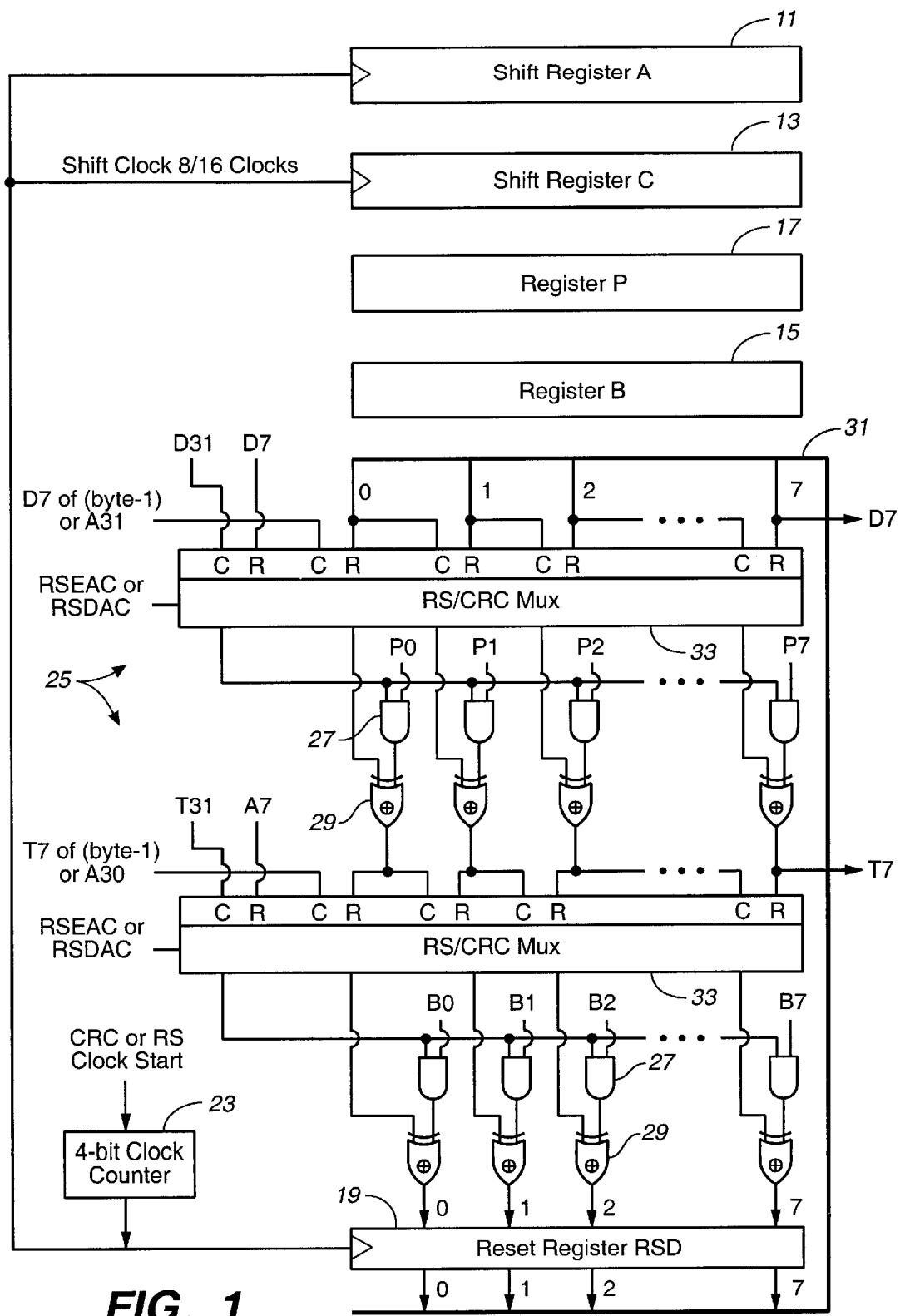
*FIG._1*

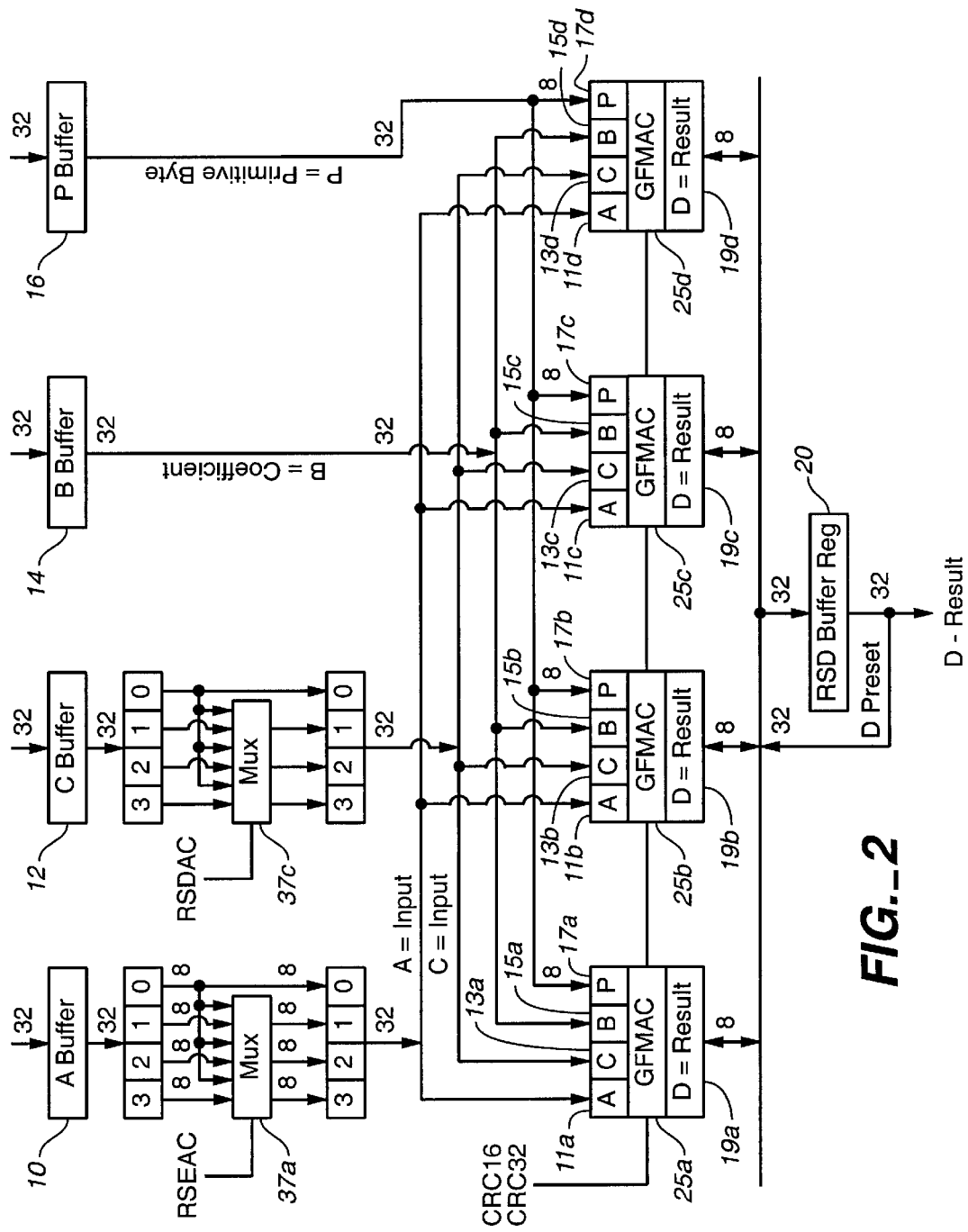
FIG._2

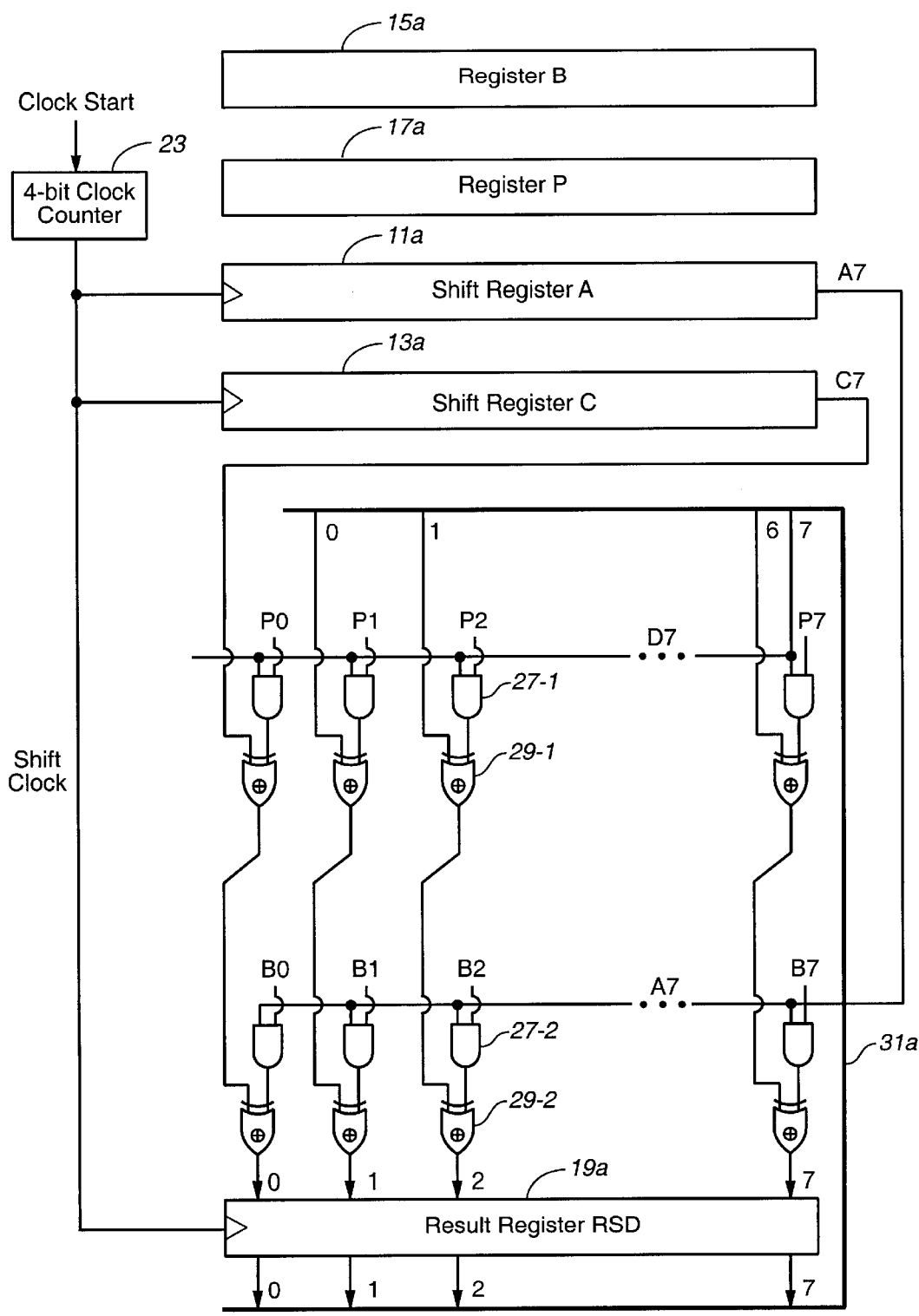
FIG._3

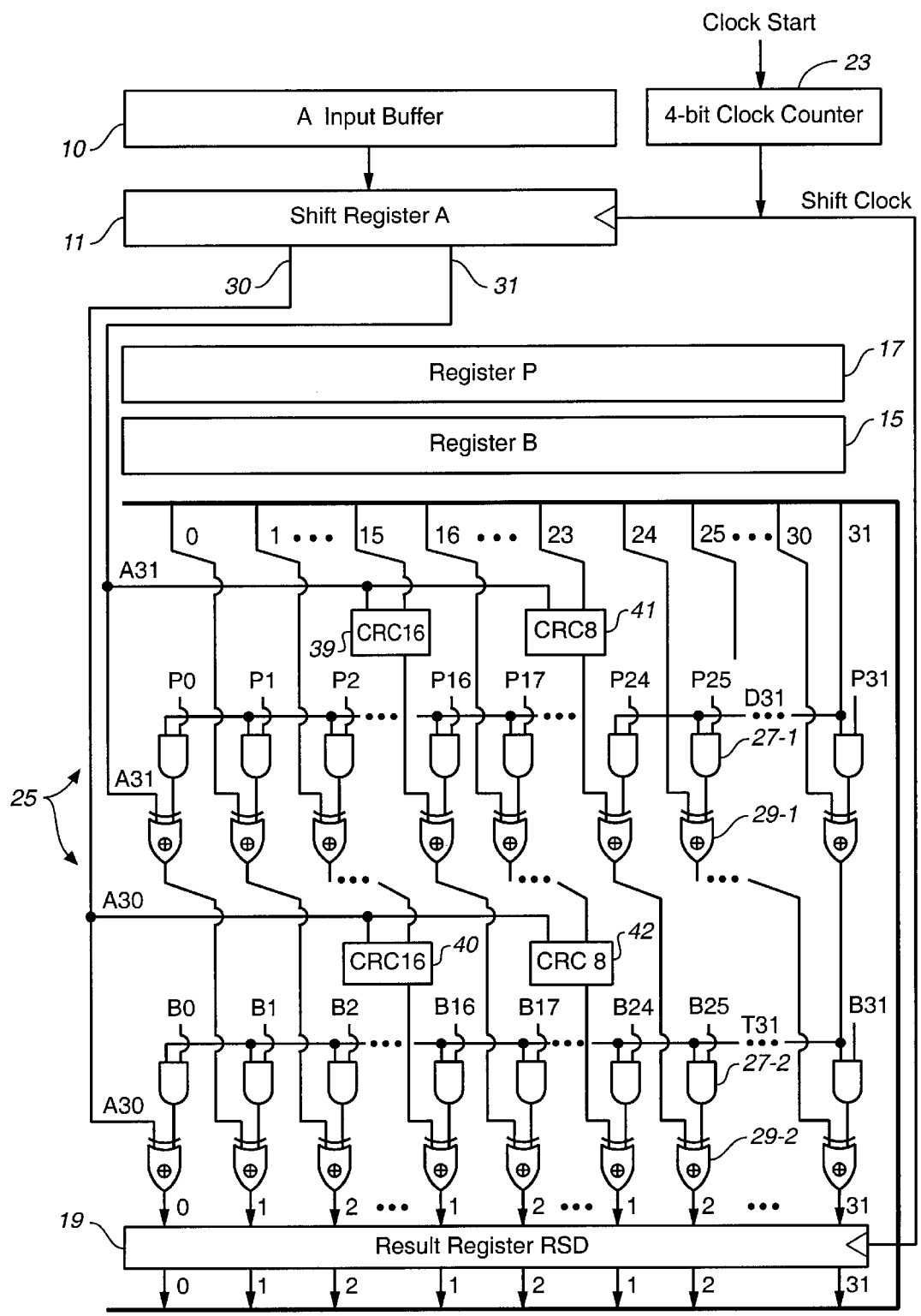
FIG._4

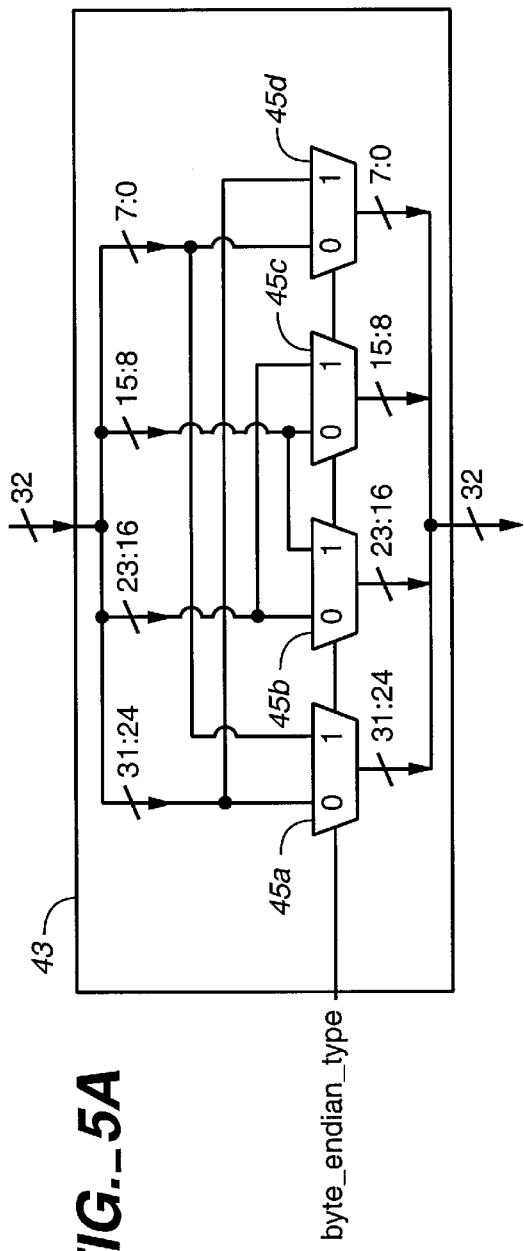
FIG._5A
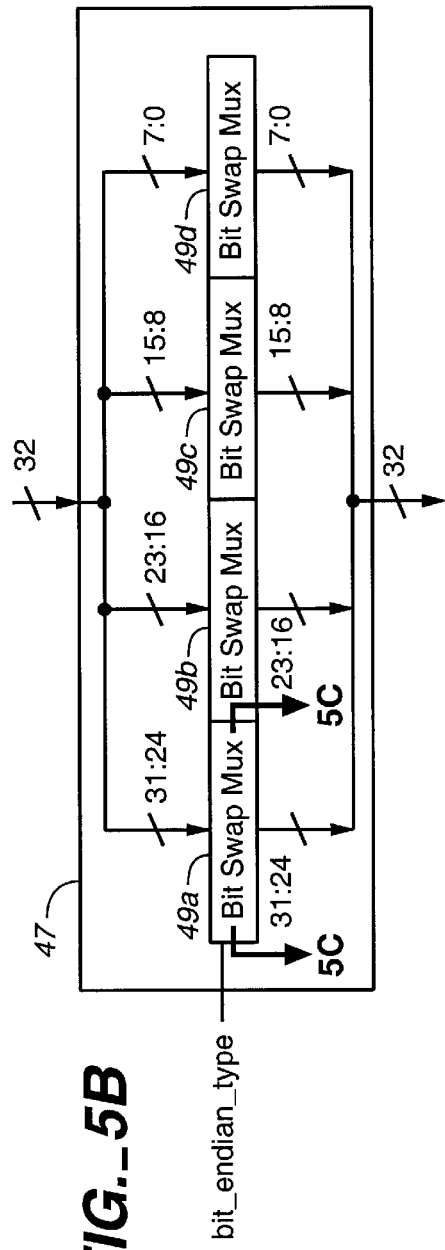
FIG._5B

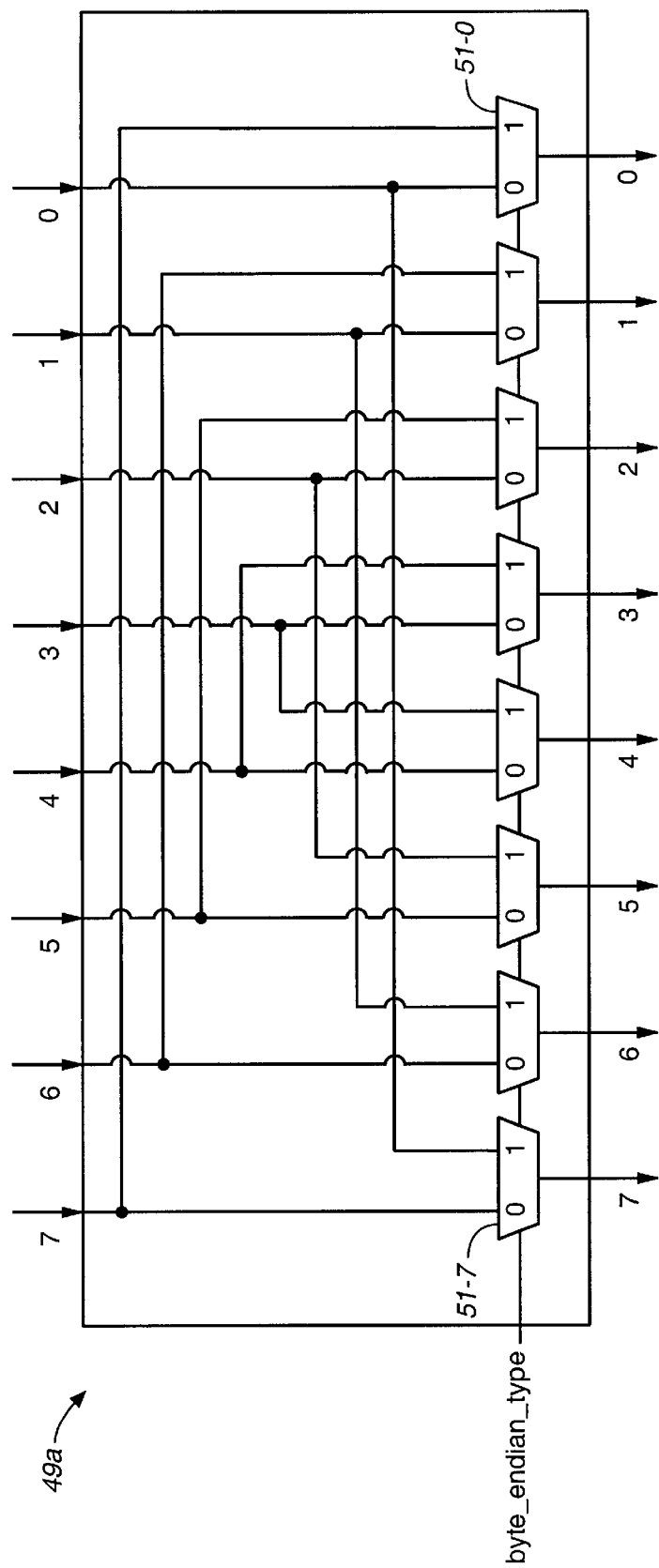
FIG._5C

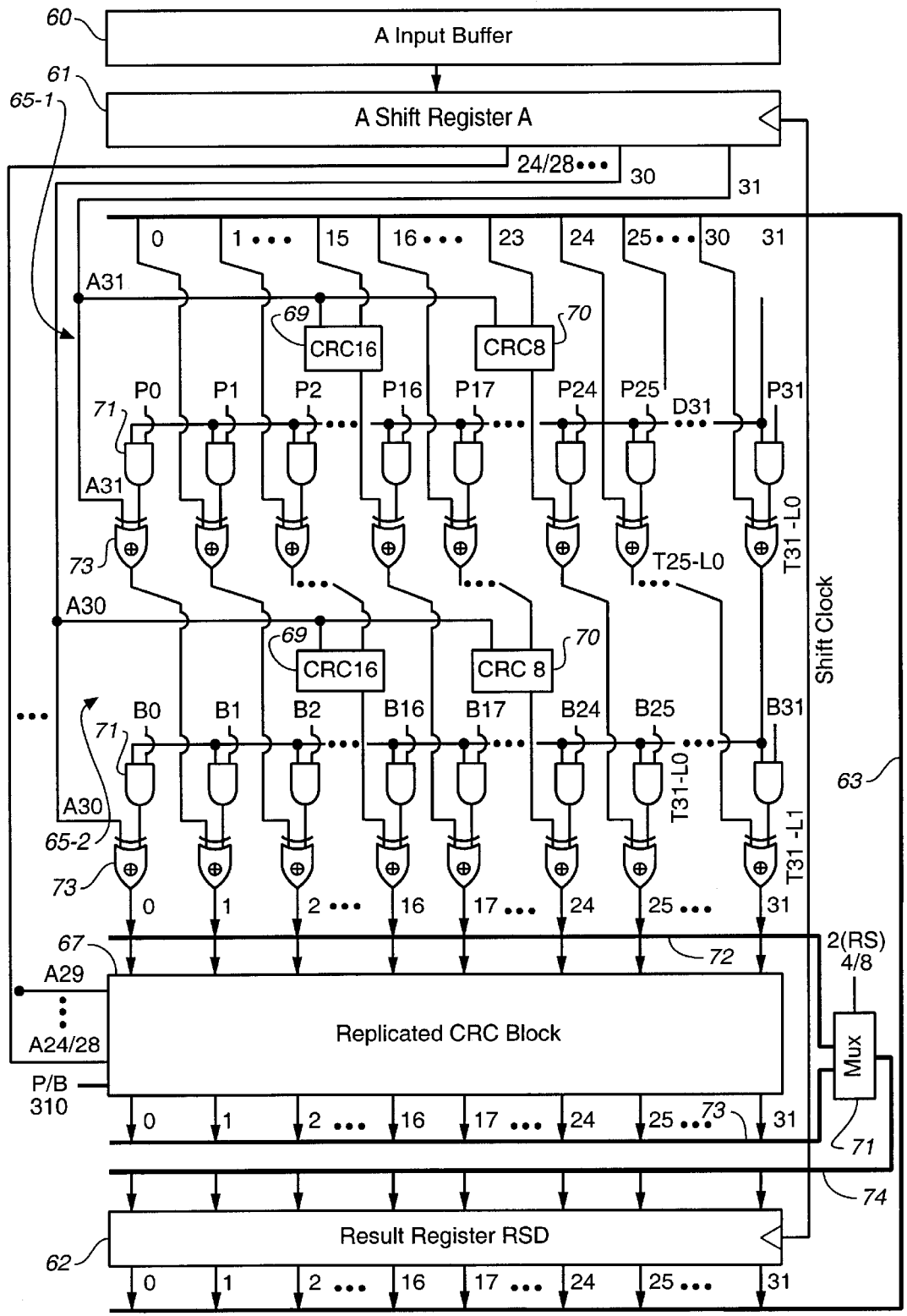
FIG._6

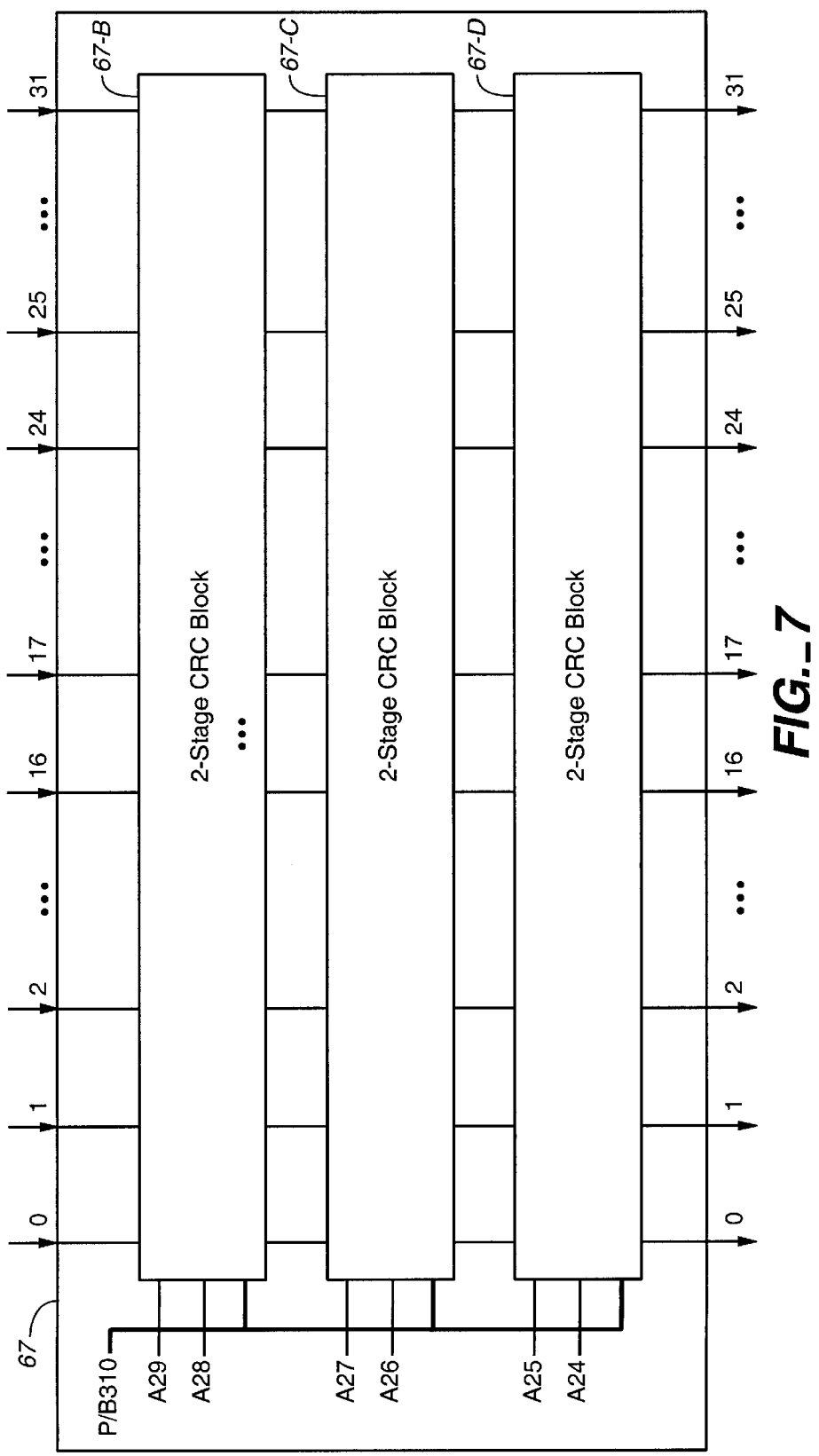
FIG._7

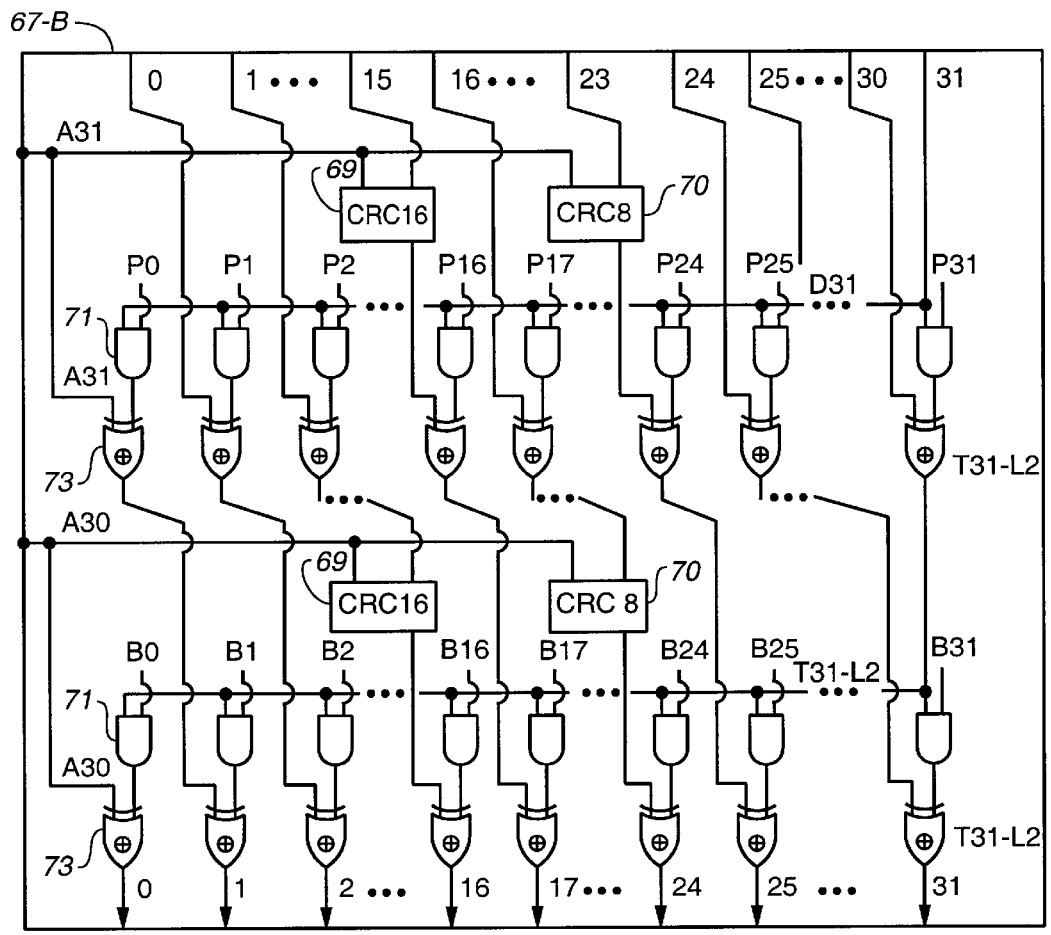
FIG._8

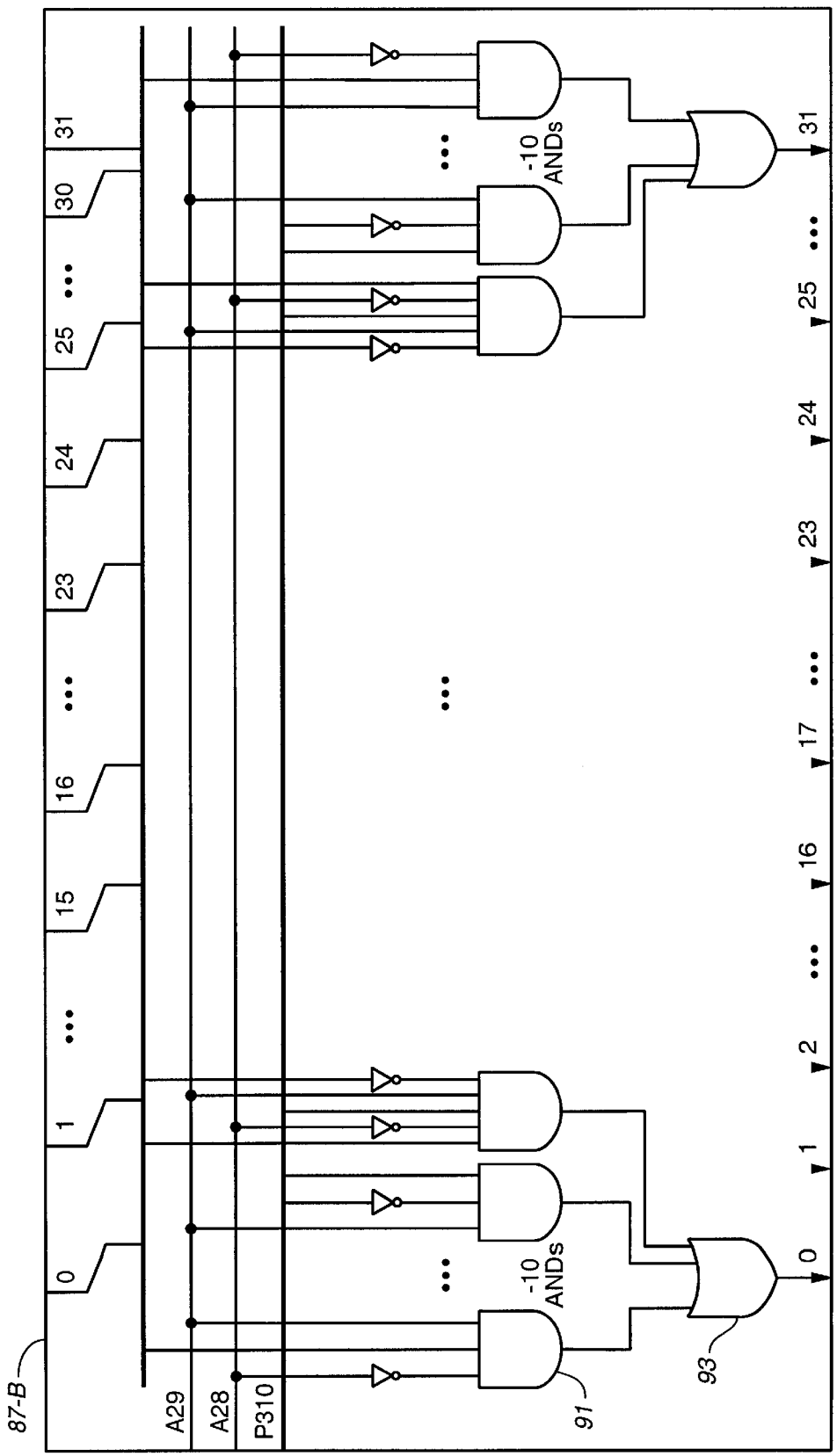
FIG._9

COMBINED CYCLIC REDUNDANCY CHECK (CRC) AND REED-SOLOMON (RS) ERROR CHECKING UNIT

CROSS-REFERENCE TO RELATED APPLICATION

The present application claims priority under 35 U.S.C. § 119(e) from prior provisional application No. 60/266,002, filed Feb. 2, 2001.

TECHNICAL FIELD

The present invention relates to error detection and correction circuitry for reliable digital data storage or transmission. In particular, the invention relates to circuitry that employs finite (Galois) field polynomial arithmetic for generating error checking codes, such as Reed-Solomon (RS) codes and cyclic redundancy check (CRC) codes, or for decoding data containing such codes.

BACKGROUND ART

Error checking codes have been developed to assure digital data integrity in situations such as transmission of data over a communications channel or data storage onto and retrieval from a storage medium. The codes allow the existence of errors in the data stream to be identified and in most cases corrected. Two widely used error correction codes are Reed-Solomon (RS) and cyclic redundancy check (CRC) codes. They are often used together, with RS codes being used for every block of 255 bytes of an encoded word, and CRC codes being used cumulatively for every packet of 10 or 20 RS encoded blocks. Typically, distinct circuitry is used to generate the respective RS and CRC codes, although the respective circuitry can be largely operated in parallel.

In U.S. Pat. No. 5,383,204, Gibbs et al. describe an error correction system having distinct RS encoding and CRC encoding hardware units sharing the same codeword memory and processing the data largely in parallel. The CRC check bytes are calculated on a data packet, while the RS processing is done for each data block, or in the case of the final four blocks of a packet, for the data blocks plus CRC check bytes. Since the data that the two units encode is the same, only the RS encoding of the CRC check bytes appended to the final four blocks is not parallizable. Once the CRC check bytes have been calculated, the RS bytes can be calculated for those final blocks. The patent deals with how the codeword memory accesses are sequenced under the operation of the two encoding units.

In U.S. Pat. No. 5,671,237, Zook describes a two-stage CRC encoding/decoding system. The first stage takes the input data, encodes it, and puts both the input data and $K_1$ CRC bytes in memory. Then the second stage (with $K_2 > K_1$ streams) takes the input data plus K1 CRC bytes from the memory, verifies that no errors were introduced by the memory, encodes it, and passes the data plus $K_2$ CRC bytes as output from the unit. Each CRC stage (a generator/checker) uses programmable 8-bit generator polynomials. Each stage has a segmenter, which splits a data input stream into a programmable number of substreams, and has a programmable variable number (m) of parallel CRC units, each operating on a separate data substream. The first byte goes to a first CRC unit, the second byte to a second CRC unit, the $m^{th}$ byte to an $m^{th}$ CRC unit, the (m+1)-st byte to the first CRC unit, etc., until the end of the input data. The error checking capability of the CRC system, usually limited to detecting errors lying entirely in one 8-bit block, is enhanced by multiple staging and by interleaving.

In U.S. Pat. No. 5,375,127, Leak et al. describe a system for processing high bandwidth data block transfers, having a plurality of dedicated, RS error correction code (ECC) generation circuits that operate in parallel in order to handle multiple input data words simultaneously. The block connections can be reconfigured depending on the width of the input data, including a configuration for serial operation when input data is presented one word at a time.

In U.S. Pat. No. 5,136,592, Weng describes a technique that increases the detectable and correctable burst error length by arranging the data bits in a two-dimensional array of d columns by x lines and applying RS encoding to every column and CRC encoding on every line.

It is an object of the invention to provide a single processing circuit that is capable of operating, responsive to program instructions, in both an RS mode (encode or decode) and a CRC mode.

DISCLOSURE OF THE INVENTION

The object is met by a circuit that shares both registers and a multi-stage processing engine capable of implementing finite (Galois) field arithmetic operations used in both RS and CRC encoding and decoding. In particular, this error checking circuit includes 4 input register, designated A, C, B and P for receiving and holding operands for finite-field arithmetic operations associated with RS and CRC codes, a result register, designated RSD, for holding and outputting a result of the particular finite field arithmetic operations, or intermediate results during the operation, and a combinatorial finite-field arithmetic circuit connected to the registers and selectively configurable in response to program instructions to operate in RS and CRC modes, as directed. Specifically, the arithmetic circuit is configured in RS mode to carry out an iterated bitwise multiply-accumulate operation and is configured in CRC mode to carry out, in an iterated manner, a polynomial modulo division operation.

Two of the input registers A and C are shift registers responsive to a clock counter for transferring individual bits to the arithmetic circuit. The result register RSD has feedback connections to the arithmetic circuit and provides parallel bit output to the feedback bus. The registers are preferably buffered, and thus have a buffer register and a working register. The registers may also have bit and byte swap multiplexers for use with certain CRC standards. For RS mode, the A and C registers have associated multiplexers responsive to respective RS encode and RS decode instructions which broadcast the least significant byte in the A or C register to all of the other byte locations of that register.

The arithmetic circuit is a multi-stage combinatorial circuit made up of pairs of stages, where each stage includes a set of AND gates and a set of XOR gates, the gates being associated with specific bit locations. The output of each AND gate is connected to one input of its associated XOR gate. The first stage XOR gate outputs are connected to the second stage via a configuration multiplexer unit, with different connections being selected in RS and CRC modes. Another configuration multiplexer unit selects connections between the result register feedback and the first stage according to the operating mode.

The two-stage implementation can be replicated two or four times to obtain 4-stage or 8-stage arithmetic circuits for faster CRC processing. The operation of the input shift register A is modified to supply appropriate bits to each of the stages. The RS processing continues to be performed by the first two stages in any of the implementations, and a multiplexed bus is provided so that the result register RSD is supplied with operational results after the final (fourth, or eighth) stage in the CRC mode, but after the second stage in RS mode.

BRIEF DESCRIPTION OF THE DRAWINGS

FIG. 1 is a schematic block diagram of a combined RS/CRC byte-processing unit in accord with the present invention for both RS encoding and decoding and CRC check code generation.

FIGS. 2 and 3 are schematic block diagrams of the unit of FIG. 1 when configured to operate in RS mode. FIG. 2 illustrates the register buffering, while FIG. 3 details the two-stage combinatorial circuitry used for the byte processing of register data.

FIG. 4 is a schematic block diagram of the unit of FIG. 1 when configured to operate in CRC mode, and detailing the two-stage combinatorial circuitry used for the byte processing of register data.

FIGS. 5A, 5B and 5C are schematic block diagrams of a byte-endian multiplexer (FIG. 5A), a bit-endian multiplexer (FIG. 5B) and a bit-swap multiplexer for the bit-endian multiplexer (FIG. 5C), associated with the registers of the unit in FIG. 1 for implementing reflect operations on data in accord with a specified CRC standard.

FIG. 6 is a schematic block diagram of an alternative RS/CRC processing unit, seen here when configured in CRC mode, which has additional pairs of combinatorial stages in the arithmetic circuitry compared to the embodiment in FIG. 4.

FIG. 7 is a schematic block diagram showing a detailed view of signal paths through the additional pairs of stages in the unit of FIG. 6.

FIGS. 8 and 9 are schematic block diagrams of alternative implementations of the pairs of stages in each two-stage block of the arithmetic circuitry.

BEST MODE OF CARRYING OUT THE INVENTION

The RS/CRC Hardware Unit

With reference to FIG. 1, in order for the combined Reed-Solomon (RS)—Cyclic Redundancy Check (CRC) unit to use the same processing circuitry for RS encode and decode and also for CRC generation, the unit has two distinct modes of operation, an RS mode and a CRC mode, configured by multiplexers 33 in response to received instructions. The unit operates in its RS mode when executing RSEAC (RS encode) and RSDAC (RS decode) instructions. The unit operates in its CRC mode when executing any of several CRC instructions (CRC32, CRC16, CRC8, CRX32, CRX16, CRX8), which also specify 8-bit, 16-bit and 32-bit operation.

The unit has five 32-bit registers 11, 13, 15, 17, and 19: four input registers (A, B, C and P) and one output register (RSD). Registers A and C are shift registers controlled by a shift clock generated by a 4-bit clock counter 23 responsive to a start signal when beginning an RS or CRC instruction. In the embodiment of FIG. 1, register A shifts by two bits per clock in CRC mode. (In alternative embodiments, detailed below with reference to FIGS. 6 to 9, the register A shifts by four or eight bits per clock in CRC mode.) The register RSD is a result register that has data latched into it on a clock edge. Register P is loaded with a generator polynomial for the particular RS or CRC operation. Register B is loaded with a coefficient in RS mode or with a copy of the generator polynomial in CRC mode. The generator polynomial loaded into register P (and register B in CRC mode) may be 8-bits, 16-bits or 32-bits, with a (most significant) $9^{th}$, $17^{th}$ or $33^{rd}$ bit of the generator not stored, but simply implied, as it is always one. 8-bit or 16-bit generators are packed into the most significant 8 or 16 bit locations in the register, in which case the lower 24 or 16 bits of the register are unused.

The A, B, C and P registers are preferably double buffered at their inputs, as seen by buffers 10, 12, 14 and 16 in FIG. 2, and the RSD register likewise has an output buffer 20 in addition to its working register 19. With double buffering, the unit can read out the result of a prior calculation and set up a next calculation while a current calculation is still in progress.

The unit in FIG. 1 includes a two-stage combinatorial circuit 25 with 32 AND gates 27 and 32 XOR gates 29 in each stage, together with feedback 31, for performing polynomial arithmetic over a finite (Galois) field GF(2) or GF(256). Alternative units having multiple pairs of combinatorial stages (e.g., 4-stage and 8-stage) will be detailed in the discussion of FIGS. 6-9 below. For RS operations, the combinatorial circuit performs modulo long division on data blocks of specified size by iteratively performing a series of GF(256) multiply-accumulate steps, as described below, where the data block of length r bytes is regarded as a polynomial of order r–1 over GF(256), and where each byte in the block is a coefficient of that polynomial lying in GF(256) that is treated as a polynomial of order 7 or less over GF(2). The RS operations are 8-bit operations that can be performed in parallel on 4 sets of byte-size operands at a time, all packed into the 32-bit registers. (Alternatively, if not packed for parallel operation, the byte-size operands would normally be loaded into the least significant byte location of a corresponding register.) In CRC operations, the unit does a cumulative polynomial modulo division on an entire data packet by iterated subtraction (the same as addition in GF(2) polynomial arithmetic), where a packet of length n bytes is treated as a polynomial of order 8·n–1 over GF(2). A set of configuration multiplexers 33 switch the unit's operation between RS and CRC modes, between 8-bit, 16-bit and 32-bit polynomials when in CRC mode.

As seen in FIG. 2, in RS mode the unit operates on 4 sets of operands in parallel. The 32-bit registers A, C, B and P hold 4-sets of byte-wide operands, as represented by the register byte locations 11a, 13a, 15a, and 17a for the most significant byte (bits 31–24) of the registers, byte locations 11b, 13b, 15b and 17b for the next most significant byte (bits 23–16) of the registers, byte locations 11c, 13c, 15c, and 17c for the third most significant byte (bits 15–8) of the registers, and byte locations 11d, 13d, 15d, and 17d for the least significant byte (bits 7–0) of the registers. Each set of operands is operated on by a corresponding segment 25a, 25b, 25c and 25d of the combinatorial circuitry performing iterated GF multiply-accumulate, as described below with respect to RS operation. Likewise, the results register is segmented into bytes 19a, 19b, 19c and 19d. The final result is loaded via a bus 35 into the corresponding byte locations of the RSD output buffer register 20 at the conclusion of an RS calculation for a particular data block.

Also seen in FIG. 2, a least significant byte broadcast is used for the A and C registers in executing the respective RS encode and RS decode instructions, as explained further in the discussion of RS operation below. This byte broadcast is implemented using multiplexers 37a and 37c. During an RS encode instruction, multiplexer 37a selects the least significant byte 0 (bits 7–0) from register A's input buffer 10 and loads it into all of the byte locations 11a, 11b, 11c and 11d of working register A. In all other RS and CRC instructions, broadcast of register A is not in effect, and thus when loading operands from register A's input buffer 10 into its working register 11, the multiplexer 37a selects all of the byte locations 3–0 in the A buffer 10 and loads them into the corresponding segments 11a, 11b, 11c and 11d. Similarly, during an RS decode instruction, multiplexer 37c selects the least significant byte location 0 (bits 7–0) from register C's input buffer 12 and loads it into all of the byte locations 13a, 13b, 13c and 13d of working register C. In all other RS and CRC instructions, broadcast of register C is not in effect, and thus when loading operands from register C's input buffer 12 into its working register 13, the multiplexer 37c selects all of the byte locations 3–0 in the C buffer 12 and loads them into the corresponding segments 13a, 13b, 13c and 13d of working register C. There is no corresponding broadcast of register B or P in any instruction.

Turning now to each byte segment's GF multiply-accumulate circuitry in FIG. 3, a set of AND gates 27-1 and 27-2 and XOR gates 29-1 and 29-2 implement in two stages the multiply and accumulate steps upon the contents of registers A, C, B, P and RSD. In finite field arithmetic, multiplication is equivalent to a bit-wise AND of the corresponding bits of the byte-wide operands being multiplied. Likewise, addition and subtraction are both equivalent to a bit-wise XOR of the corresponding bits of the byte-wide operands being added or subtracted.

The registers A and C are shift registers that shift the contents one by one out of their most significant bit locations in response to a shift clock supplied by the 4-bit clock counter 23 so as to supply register bit contents A7 and C7 to specific gates of the combinatorial circuitry. Register RSD segment 19a has data latched into it from the combinatorial circuitry when a clock edge occurs. Register RSD segment 19a supplies feedback bits D6 to D0 in parallel to corresponding first stage XOR gates 29-1, and also supplies feedback bit D7 to one input of each of the first stage AND gates 27-1.

In the first stage of the combinatorial circuitry, each of the 8 AND gates 27-1 in the segment receive at one of their inputs the feedback bit D7 from the result register 19a. These AND gates receive at their other input, the corresponding bit P7 to P0 of the generator polynomial from the P register segment 17a. Also in the first stage, the 8 XOR gates 29-1 in the segment receive at one of their inputs the output from the corresponding AND gate. At the other XOR input, the bits D6 to D0 fed back from result register 19a via feedback bus portion 31a and also the bit C7 shifted out of the C register segment 13a are received by a corresponding XOR gate 29-1 in the order depicted in the figure.

In the second stage of the circuit, a second set of 8 AND gates 27-2 receive at one of their inputs the bit A7 shifted out of the A register segment 11a. At the other of these AND gates' inputs, a corresponding bit B7 to B0 is received. The output bits from these AND gates are supplied to corresponding inputs of 8 XOR gates 29-2. The other input to each of these second stage XOR gates 29-2 receives the output from corresponding XOR gates 29-1 of the first stage. The output of the second stage XOR gates 29-2 is loaded into the RSD register segment 19a.

With reference to FIG. 4, in the CRC mode of operation the same combinatorial circuitry is used, but is not conceptually divided into byte-size segments operating in parallel on different sets of data block coefficients as in RS mode, since the CRC modulo division operates 32-bits at a time on the data packet treated as a single long polynomial.

The A input buffer 10 loads 4 bytes (32 bits) of an input data stream into the A shift register 11. The A register 11 shifts two bits per clock in the CRC mode, transferring bits A31 and A30 out of the register to respective first and second stages of the combinatorial circuitry 25 in response to each clock pulse supplied by the 4-bit clock counter 23. The unit's C register 13 is not used in CRC mode. The B and P registers 15 and 17 are loaded with identical copies of the generator polynomial in response to a RSPB instruction. The P register contents P31 to P0 are used by the first stage of combinatorial circuitry 25, while the B register contents B31 to B0 are used by the second stage. The working contents D31 to D0 in the result register RSD are also used in feedback via a bus 31 to the first stage XOR gates 29-1.

Because the CRC generation can use 32-bit, 16-bit or 8-bit generator polynomials (packed into the most significant end of the B and P registers if less than 32-bits), the circuitry 25 includes configuration multiplexers 39–42 for setting up operation with the smaller generators. In particular, if an 8-bit generator is used, then multiplexers 41 and 42 select the two transferred bits A31 and A30 from the A register for supply to the respective first and second stage XOR gates 29-1 and 29-2 corresponding to the bit 24 location. If a 16-bit generator is used, then multiplexers 39 and 40 select those transferred bits A31 and A30 for supply to the XOR gates corresponding to the bit 16 location. If a 32-bit generator is used, the bits A31 and A30 are supplied to the XOR gates corresponding to the bit 0 location. The other first stage XOR gates 29-1 receive feedback bits D31 to D25, D31 to D17 or D31 to D1, depending on the generator size. The other second stage XOR gates 29-2 receive first stage XOR gate outputs corresponding to bits 30 to 24, 30 to 16 or 30 to 0, again depending on the generator size. (Actually, all gates have inputs regardless of generator size, but since the generator values in the unused bits of registers P and B for small order generators are zero, the corresponding register RSD values for the unused bits always remain zero.)

The first stage of the combinatorial circuit 25 has 32 AND gates 27-1 receiving at a first input the D31 bit fed back from the RSD result register 19. At their second inputs, the corresponding AND gates 27-1 receive the generator bits P31 to P0 from the P register 17. Also in the first stage, the 32 XOR gates 29-1 receive at one of their inputs the output from the corresponding AND gate. At the other XOR input, the bits D30 to D0 fed back from result register 19 via feedback bus 31 and also the bit A31 shifted out of the A register 13 are received by a corresponding XOR gate 29-1 in the order depicted in the figure.

In the second stage of the circuit, a second set of 32 AND gates 27-2 all receive at one of their inputs the intermediate result bit T31 output from the first stage XOR gate 29-1 that corresponds to the 31 bit position. At the other of these AND gates' inputs, a corresponding generator bit B31 to B0 is received. The output bits from these AND gates 27-2 are supplied to corresponding inputs of 32 XOR gates 29-2. The other input to each of these second stage XOR gates 29-2 receives the output from one of the first stage XOR gates 29-1 which is shifted by one bit between stages from the corresponding bit location. Thus, the second stage XOR gate 29-2 corresponding to bit position 31 receives the first stage XOR output corresponding to bit position 30, . . . , and second stage XOR in bit position 1 receives the first stage XOR output in bit position 0. The second stage XOR gate 29-2 in bit position 24, 16, or 0 receives the second of the two bits, A30, shifted out of the A register 11, as specified by the generator size multiplexers 40 and 42, as explained above. The output of the second stage XOR gates 29-2 is loaded into the RSD working register 19.

With reference to FIGS. 5A-5C, some CRC standards specify input or output reflection of data bits. The bit-endian and byte-endian multiplexers perform the bit swapping necessary to effect such reflection. These multiplexers may be located at the input side of the register A input buffer 10, or alternatively, between the register input buffer 10 and the working A register 11. They can also be located on the output side of the result output buffer 20, or alternatively, between the working result register 19 and the output buffer 20. These multiplexer circuits have control inputs specifying the byte_endian and bit_endian type of the particular CRC standard being implemented. To support both little-endian and big-endian byte ordering of data, multiplexer elements 45a–45d in FIG. 5A choose whether or not to swap bytes 3 and 0 and bytes 2 and 1. These bytes are swapped for a big endian type CRC standards, but are left in original order for little endian standards. Similarly, bit-endian multiplexer 47 in FIG. 5B has a set of byte-size bit-swap multiplexers 49a–49d, detailed in FIG. 5C, which in turn are made up of 2:1 multiplexers 51-7 to 51-0 responsive to the bit-endian type control signal. To support both little-endian and big-endian bit ordering of data within each byte, the bits 7 and 0, 6 and 1, 5 and 2, 4 and 3 can be swapped in each byte. For little endian type CRC standards, the bits 7 to 0 are left in original order. The byte-ordering and bit-ordering are generally specified independently for both input and output, and for both byte-endianess and bit-endianess.

A control word stored in a register configures the input and output bit-endian and byte-endian muxes to transfer data into register A and out from register RSD according to the particular CRC standard being used:

| Bit | Function |
| --- | --- |
| 31:4 | reserved |
| 3 | CRC output byte endianness<br>0 => little-endian;<br>1 => big-endian |
| 2 | CRC output bit endianness<br>0 => little-endian;<br>1 => big-endian |
| 1 | CRC input byte endianness<br>0 => little-endian;<br>1 => big-endian |
| 0 | CRC input bit endianness<br>0 => little-endian;<br>1 => big-endian |

Returning to FIG. 1, the connections to the first and second stage gate inputs are set by the RS/CRC multiplexers 33. A comparison of FIGS. 3 and 4 show the differences in the connections between RS mode and CRC mode. In CRC mode, each first stage AND gate receives a D31 bit fed back from result register 19, but in RS mode, each byte segment receives the corresponding D7 bit output from the corresponding result register segment 19a, 19b, 19c or 19d. In CRC mode, the first stage XOR gates receive corresponding bits A31 (to bit position 0, 16 or 24 as noted above) and D0 to D30 fed back from the result register 19 along bus 31, but in RS mode, each byte segment receives the corresponding bits C7 and D0 to D6, from corresponding register segments 13a–d and 19a–d. In CRC mode, each second stage AND gate receives a T31 bit output from the first stage XOR gate in bit position 31, but in RS mode, each byte segment receives the A7 bit shifted out of the corresponding A register segment 11a–11d. In CRC mode, the second stage XOR gates receive corresponding bits A30 (to bit position 0, 16 or 24 as noted above) and the first stage XOR outputs shifted by one bit position, but in RS mode, every second stage XOR gate receives the corresponding first stage XOR output with the same corresponding bit position. Multiplexers 33 set these configurations.

RS Mode of Operation

The RS/CRC unit has a Reed-Solomon mode of operation, which can be used to encode and decode data packets. A Reed-Solomon code is a linear block code that allows recovery of the original information block in the event of data symbol errors or erasures. A Reed-Solomon code RS(n,k) takes k data symbols of s bits each and adds n–k parity symbols, also of s bits each, to make an n-symbol codeword. For a given symbol size s, the maximum RS codeword length n is $2^s-1$. Typically, s=8 for byte-size symbols and a maximum codeword length of n=255. A popular Reed-Solomon code is RS(255,239). In that code, the codeword size is 255 bytes, the information block being encoded is 239 bytes and the number of parity symbols added to the information block to produce the RS codeword is n–k=16 bytes. Using an RS code, the decoder can recover the original codeword (and hence the original information block) if the number of symbol errors e and the number of symbol erasures r is limited such that $(2e+r) \leq (n-k)$.

The RS codeword is generated using a generator polynomial g(x) having the special form:

$$g(x)=(x-\alpha^i)(x-\alpha^{i+1}) \ldots (x-\alpha^{i+n-k}),$$

where $\alpha$ is a primitive element of the field $GF(2^s)$. Multiplying out g(x) we get:

$$g(x)=x^{n-k}+g_{n-k-1}x^{n-k-1}+ \ldots +g_2x^2+g_1x+g_0,$$

where the $g_j$ are s-bit (for s=8, byte-size) coefficients of the generator. The RS codeword c(x) is constructed from the information block i(x) using the equation $c(x)=i(x) \cdot g(x)$ in $GF(2^s)$. That is, all valid RS codewords are exactly divisible by the generator polynomial g(x), and erroneous codewords have remainder other than zero that allows most symbol errors and erasures in the codeword to be corrected. The n–k parity symbols p(x) in the RS codeword are given by:

$$p(x)=i(x) \cdot x^{n-k} \bmod g(x),$$

where the polynomial modulo division is carried out in $GF(2^s)$. The parity symbols are the coefficients of the remainder $p(x)=p_{n-k-1}x^{n-k-1}+ \ldots +p_1x+p_0$.

In the preferred embodiment of the present invention, the symbols are bytes (s=8) and operations are carried out in the finite field GF(256). A data packet of length r bytes is treated as a polynomial of order r–1 over GF(256). Each byte in the data packet is a coefficient lying in GF(256), and can be regarded as a polynomial of order 7 or less over GF(2).

The finite field operation $p(x)=i(x) \cdot x^{n-k} \bmod g(x)$ can be performed as a series of multiply and accumulate steps, as described below. When configured in RS mode, the RS/CRC unit performs a Galois-Field multiply-accumulate operation (GFMAC) in the field GF(256). Referring to the operands by the registers in which they are stored, the particular GFMAC operation is $RSD=((A*B)+C) \bmod P$, where each of the operands A, B and C is a byte regarded as a polynomial of order 7 or less over GF(2), and P is an irreducible generator polynomial of order 8 over GF(2). This is an 8-bit operation. Partial results are saved in the register RSD after each step until the RS operation is completed.

The unit has five 32-bit registers, each holding four bytes at any one time. These are the same registers that are used for CRC code generation when the unit is in the CRC mode. Each of the four bytes in a register operates independently and in parallel with the other three bytes in that register. In the RS mode, the unit can process four sets of bytes in parallel, performing 4 independent multiply-accumulate operations simultaneously. It takes 8 clock cycles to complete the 4 parallel multiply-accumulate operations. The registers are used as follows in RS mode:

Input Registers
A—4 multiplicands
B—the other 4 multiplicands
C—4 additive constants
P—the irreducible polynomial
Output Registers
RSD—the 4 results The unit has two Reed-Solomon instructions: RSEAC is the encode instruction and RSDAC is the decode instruction. Although very similar, there are subtle differences between these instructions, which will be explained in the following.

Both RSEAC and RSDAC perform the GFMAC operation $RSD=((A*B)+C) \mod P$ on the 4 sets of 1-byte operands. The P register is loaded with the generator polynomial by a RSPB instruction. (The B register is loaded also, but is subsequently overwritten with operand data. Unlike the CRC mode described below, the B register has a different function in RS mode.) For both RSEAC and RSDAC instructions the polynomial P is loaded into the least significant byte of the P register, and that byte is broadcast to all 4 GFMAC units; the other 3 bytes in the P register are ignored.

RSEAC uses only the least significant byte of the A register, and that byte is broadcast to all 4 GFMAC units; the other 3 bytes in the A register are ignored. RSEAC uses all bytes in the B and C registers and produces a 4-byte result in the D register.

RSDAC uses only the least significant byte of the C register, and that byte is broadcast to all 4 GFMAC units; the other 3 bytes in the C register are ignored. RSDAC uses all bytes in the A and B registers and produces a 4-byte result in the D register.

RS operations typically consist of 2 to 10 RS instructions, depending on the algorithm. To use the unit in RS mode, you execute two instructions: first RSPB, which loads the P and B registers, and then RSEAC or RSDAC, which load the A and C registers, transfer current RSD register data to the RDS register output buffer, clear the RSD register, and start the unit's clock.

The P, B, A and C registers are double buffered at their inputs, and the RSD register has an output buffer in addition to its working register. With double buffering, the unit can read out the result of a prior calculation from the D buffer and set up the second RS calculation while the current calculation is in progress. Since complete RS operations take several RS instruction cycles, and because the number of clock cycles required to set up the next RS instruction cycle is similar to the 8 clocks of RS instruction execution, the unit can be kept continuously busy by setting up the next RS instruction and reading the results of the previous operation and while a current operation is still in progress.

A first RSEAC or RSDAC instruction will start the unit working. While the unit is working, another RSPB instruction can be issued to set up the P and B registers (a load into their input buffers) for the next calculation and another RSEAC or RSDAC instruction issued to set up the A and C registers (also a load into their input buffers). Previous results can be moved from the RSD register's output buffer using a MOV instruction. Premature attempts to access an RSD result (still only partial) of a current operation will stall until the final result is ready and transferred to the RSD output buffer. When a second RSEAC or RSDAC instruction is issued while a first operation is in progress, the second instruction is held until the current RS operation is complete. When the current RS operation is completed, the RSD results are clocked into RSD output buffer, then the new P, B, A and C values are loaded from the input buffers to their associated working registers so that the second RS operation begins execution.

The RS/CRC unit is typically part of a larger processor system and, for example, used in conjunction with memory transfer control circuitry. In this typical case, a Pause instruction issued after a second RSEAC or RSDAC instruction allows the other processor elements of the system to do other things while the RS unit is running. A RSEAC or RSDAC instruction will also set a status bit that is cleared when the operation is completed, alerting the system that the RS (and CRC) resources are again available.

Encoding

Reed-Solomon encoding consists of a polynomial division $D(x) \mod g(x)$, where $D(x)$, is the packet being encoded and $g(x)$ is the (monic) generator polynomial, of order $2t=n-k$, over $GF(256)$. Typically $2t=16$, which we will assume to be the case in the example below; the data packet is assumed to have a length r longer than 2t bytes, and is typically the maximum correctable RS byte-size of $255-16=239$ bytes for the uncoded information packet. As this is a modulo division operation, only the remainder of the division is of interest; the remainder is appended to the packet to form the codeword $T(x)$.

The RS/CRC unit can be used to perform the division on a data packet of length r as follows:

Let $D(x)=D_{r-1}x^{r-1}+ \ldots +D_1x+D_0$

Let $g(x)=x^{16}+g_{15}x^{15}+ \ldots +g_1x+g_0$

Let the quotient be $$q(x)=q_{r-17}x^{r-17}q_{r-18}x^{r-18}+ \ldots +q_1x+q_0$$

Clearly $q_{r-17}=D_{r-1}$.

We first multiply out $g(x)$ by $q_{r-17}x^{r-17}$ and subtract the product from $D(x)$, using 4 RSEAC instructions; in each instruction we multiply 4 coefficients of $g(x)$ by $q_{r-17}$ ($=D_{r-1}$) and simultaneously subtract the products from the matching coefficients of $D(x)$. At the end we have a polynomial result $F_{r-2}x^{r-2}+ \ldots +F_{r-17}x^{r-17}$ to which we add the unprocessed coefficients of $D(x)$, $D_{r-18}x^{r-18}+ \ldots +D_1x+D_0$, obtaining the iterate $F(x)$. $F(x)$ has order strictly smaller than $D(x)$.

$A=0\ 0\ 0\ D_{r-1}$
$B=g_{15}\ g_{14}\ g_{13}\ g_{12}$
$C=D_{r-2}\ D_{r-3}\ D_{r-4}\ D_{r-5}$
$RSD=F_{r-2}\ F_{r-3}\ F_{r-4}\ F_{r-5}$
$A=0\ 0\ 0\ D_{r-1}$
$B=g_{11}\ g_{10}\ g_9\ g_8$
$C=D_{r-6}\ D_{r-7}\ D_{r-8}\ D_{r-9}$
$RSD=F_{r-6}\ F_{r-7}\ F_{r-8}\ F_{r-9}$
$A=0\ 0\ 0\ D_{r-1}$
$B=g_7\ g_6\ g_5\ g_4$
$C=D_{r-10}\ D_{r-11}\ D_{r-12}\ D_{r-13}$
$RSD=F_{r-10}\ F_{r-11}\ F_{r-12}\ F_{r-13}$
$A=0\ 0\ 0\ D_{r-1}$
$B=g_3\ g_2\ g_1\ g_0$
$C=D_{r-14}\ D_{r-15}\ D_{r-16}\ D_{r-17}$
$RSD=F_{r-14}\ F_{r-15}\ F_{r-16}\ F_{r-17}$

The broadcast of A is in effect, and we gain by not having to pack register A with four copies of $D_{r-1}$. We continue our division iteratively, replacing $D(x)$ by $F(x)$ and repeating the above procedure, thus calculating the next coefficient of q(x). At the end we are left with a result polynomial of order less than 16. This is the 16-byte remainder which we append to the data packet to form the codeword T(x) of length r+16.

Decoding

The Reed-Solomon unit is used to perform decoding on the received packet R(x)=T(x)+E(x), where E(x) is the error polynomial whose order is not greater than the transmitted packet T(x), as follows:

The generator polynomial g(x) factors into 16 known factors, each of the form (x+$a_i$), where the $a_i$ are powers of a primitive polynomial $\alpha$ in GF(256). The decode operation consists of calculating the 16 syndromes:

$s_i$=R(x)mod(x+$a_i$).

We perform 4 divisions in parallel starting with 4 identical data packets R(x) and dividing by the polynomials x+$a_0$, x+$a_1$, x+$a_2$, x+$a_3$. We do 4 divisions per RSDAC instruction, processing 1 byte of R(x) per RSDAC instruction.

A=$a_3$ $a_2$ $a_1$ $a_0$
B=$R_{r+15}$ $R_{r+15}$ $R_{r+15}$ $R_{r+15}$
C=0 0 0 $R_{r+14}$
D=$D^3_{r+14}$ $D^2_{r+14}$ $D^1_{r+14}$ $D^0_{r+14}$

The broadcast of C is in effect, and we gain by not having to pack the C register with 4 copies of the current data packet byte.

We iterate r+15 times. The k'th iteration is done merely by moving 0 0 0 $R_{r+15-k}$ to register C and moving register D to register B, then executing RSDAC again. The final 4 bytes in the D registers are the first 4 syndrome bytes.

We then repeat the process to obtain the 3 remaining sets of 4 syndromes. The 3 sets of starting values are:

A=$a_7$ $a_6$ $a_5$ $a_4$
B=$R_{r+15}$ $R_{r+15}$ $R_{r+15}$ $R_{r+15}$
C=0 0 0 $R_{r+14}$
D=$D^7_{r+14}$ $D^6_{r+14}$ $D^5_{r+14}$ $D^4_{r+14}$
A=$a_{11}$ $a_{10}$ $a_9$ $a_8$
B=$R_{r+15}$ $R_{r+15}$ $R_{r+15}$ $R_{r+15}$
C=0 0 0 $R_{r+1}$
D=$D^{11}_{r+14}$ $D^{10}_{r+14}$ $D^9_{r+14}$ $D^8_{r+14}$
A=$a_{15}$ $a_{14}$ $a_{13}$ $a_{12}$
B=$R_{r+15}$ $R_{r+15}$ $R_{r+15}$ $R_{r+15}$
C=0 0 0 $R_{r+14}$
D=$D^{15}_{r+14}$ $D^{14}_{r+14}$ $D^{13}_{r+14}$ $D^{12}_{r+14}$

CRC Mode of Operation

The RS/CRC unit is capable of fast calculation of CRCs on both incoming and outgoing data streams. The unit supports standards, which specify 8-bit, 16-bit or 32-bit generator polynomials that will respectively produce an 8-bit, 16-bit or 32-bit CRC. Arbitrary packet sizes are supported. The initial value of the CRC before calculation can be set to 0 (the normal case), all 1's (which is required in many standards) or any other value specified by the particular CRC standard.

When configured in CRC mode, the unit behaves as a polynomial long division unit, calculating a CRC by dividing a data packet, treated as a polynomial, by a generator polynomial. A data packet X of length n bytes is treated as a polynomial of order 8*n−1 over GF(2). The generator polynomial P is a selected monic polynomial of order 8, 16 or 32 over GF(2) with the most significant bit being implied. The CRC unit calculates the remainder after division of X by P. The remainder after division is the CRC code for the data packet. The unit has A, P, B and RSD registers, for input data stream, generator polynomial, generator polynomial and CRC result respectively. These registers are the same as those used by the unit in Reed-Solomon (RS) mode.

CRC operations execute many CRC instructions or steps before reading out the CRC result. For example, a data packet may have 256 32-bit words (1024 bytes), requiring at least 256 CRC instructions to be executed before the result is read out. The operation is performed 32 bits at a time. It takes 16 cycles to process 32 bits. If the packet length n is congruent to 1, 2, or 3 modulo 4, an additional 4, 8 or 12 cycles are needed to process the last 1 to 3 bytes of the packet. RSD, the result register, must be initialized to an initial value specified by the selected CRC standard, usually all 0's or all 1's. The polynomial division operation is performed repeatedly on successive words of the packet, feeding portions of X into register A, starting at the most significant end, until the entirety of X, including the final 1 to 3 bytes, has been processed. The remainder in register RSD is left unchanged after each operation step and used in the next step until the entire packet has been processed. The CRC result is read from register RSD at the end.

The following instructions are used:

*RSPB ra, rb;*

In order to use the RS/CRC unit in CRC mode, you must first set up the P and B registers with the CRC generator polynomial using the RSPB instruction. RSPB, which is executed once at the beginning of the calculation, loads 2 identical copies of the generator polynomial which have been previously set up in ra and rb. It loads one copy into the P register and one copy into the B register of the CRC unit. The P and B registers are 32-bit registers. The generator polynomial has order 8, 16 or 32 which means it is 9, 17 or 33 bits long, but since the most significant bit is always 1, we need only load the least significant 8, 16 or 32 bits of the polynomial into the P and B registers. The polynomial is packed into the most significant bit end of the P and B registers. In the case of 16 and 8 bit polynomials, the lower 16 or 24 bits of the P and B registers are unused.

CRC generator polynomials are primitive over GF(2). A common 32-bit generator CRC-32 is: $x^{32}+x^{26}+x^{23}+x^{22}+x^{16}+x^{12}+x^{11}+x^{10}+x^8+x^7+x^5+x^4+x^2+x+1$, represented in the registers P and B by the (truncated) hexadecimal value 04C11DB7. There are several common 16-bit generators, including $x^{16}+x^{12}+x^5+1$ (CRC-CCITT), represented in the registers by the hexadecimal value 1021, and $x^{16}+x^{15}+x^2+1$ (CRC-16), represented by the hexadecimal value 8005. A common 8-bit generator is $x^8+x^4+x^3+x^2+1$, represented by the hexadecimal value 1D. Other primitive polynomials of order 8, 16, or 32 in the field GF(2) could be used. (E.g, there are a total of 16 primitive polynomials of order 8, and 2048 of order 16.)

Although the present preferred embodiment employs and common standards specify generators of order 8, 16, and 32, the generators need not have an order of $2^n$. For example, a generator of order 12 or 20 is possible. At some future point in time, even larger order generators, e.g. of order 40, 48, or 64, may be specified in a CRC standard.

*MOV ra, RSD;*

The RSD register is initialized by the MOV instruction. MOV, which is executed only once at the beginning of the calculation, sets register RSD to an initial value specified by ra, typically to 0 or 0xFFFFFFFF.

*CRC32 ra, rb;*

*CRC16 ra, rb;*

CRC8 ra, rb;

You use a CRC32/16/8 instruction depending on whether the generator polynomial is 32/16/8 bits long. CRC32/16/8 is executed n/4 times, where n is the packet size in bytes. CRC32/16/8 loads the next 4 bytes of the input data stream from ra into the CRC unit's A register. Only ra is used. As the data is transferred from ra to the A register, it passes through the input bit-endian and byte-endian muxes. (Some CRC standards specify that input data bytes be reflected or bits be inverted prior to processing, while other standards process the packet bytes directly.) Once in the A register, data is processed with bit 31 as the most significant bit (msb) and bit 0 as the least significant bit (lsb). rb is altered as a side effect. Following the load, the CRC instruction processes the 32-bit word one byte at a time at a rate of 2 bits per clock cycle, so that processing each input word takes 16 cycles.

The A register is preferably double-buffered so that the CRC unit can be utilized every cycle. Since CRC operations take many clock cycles (16), you can issue a second CRC instruction immediately after issuing a first one, and both calculations will proceed to completion. The unit buffers the A input value for the second instruction while the first instruction is running. When the first instruction completes, the second one begins immediately. However, if a third CRC32/16/8 instruction is attempted before the first instruction is completed and when both buffers are full, the third instruction will stall until the first instruction is complete and the unit can start another.

The RS/CRC unit is typically part of a larger processor system and, for example, used in conjunction with memory transfer control circuitry. In this typical case, a Pause instruction issued after a second CRC instruction allows the other processor elements to do other things while the CRC unit is running. A CRC instruction (and the CRX instructions described below) will also set a status bit that is cleared when the operation are completed, alerting the system that CRC resources are available.

CRX32 ra, rb;

CRX16 ra, rb;

CRX8 ra, rb

All of these instructions process one byte (8 bits) of data at a time. They are used for processing the last 1–3 bytes of a packet whose size is not an exact multiple of 4. You use a CRX32/16/8 instruction depending on whether the generator polynomial is 32/16/8 bits long. CRX32/16/8 is executed n mod 4 times, where n is the packet size in bytes. CRX32/16/8 loads the next byte of the input data stream from ra into the CRC unit's A register. Only ra is used. As the data is transferred from ra to the A register, it passes through the input bit-endian and byte-endian muxes. Once in the A register, one byte of data is processed with bit 31 as the most significant bit and bit 24 as the least significant bit. rb is altered as a side effect. Following the load, the CRX instruction processes 1 byte in 1 cycle.

MOV RSD, ra

MOV reads the CRC result from the D register. The CRC result is in bits 31:0, 31:16, or 31:24 of the D register depending on whether the generator polynomial size is 32, 16 or 8. As the data is transferred from D to the ra register, it passes through the output bit-endian and byte-endian muxes. (Some CRC standards specify that the CRC code bytes be reflected or their bits be inverted, while others use the value taken directly from the result register.)

Alternative Multi-Stage Hardware Units

With reference to FIG. 6, an alternative error checking unit capable of performing both RS and CRC data processing has an arithmetic circuit with additional pairs of combinatorial stages. The first two stages, 65-1 and 65-2, are seen in detail, while the additional pairs of stages are shown here as a block 67, described in further detail below with reference to FIGS. 7-9. For example, there can be 4-stage and 8-stage arithmetic circuits.

In FIG. 6, the A input buffer 60 loads 4 bytes (32 bits) of an input data stream into the A shift register 61. The A register 61 in the CRC mode shifts as many individual bits per clock as there are stages (e.g, bits A31 to A28 for a 4-stage circuit, or bits A31 to A24 for an 8-stage circuit). That is, as seen in FIGS. 6 and 7, the first stage 65-1 receives bit A31, the second stage 65-2 receives bit A30, the third and fourth stages in pair 67-B receive respective bits A29 and A28, and the fifth through eighth stages in pairs 67-C and 67-D, if present, receive respective bits A27 through A24. The A register 61 continues to shift only one bit per clock cycle in the RS mode. The unit's C register is not used in CRC mode. Per the previous embodiment in FIGS. 1 and 4, the B and P registers are loaded with identical copies of the generator polynomial in response to a RSPB instruction. The P register contents, P31 to P0, are used by the odd-numbered stages (the first stage in each successive pair of stages), while the B register contents, B31 to B0, are used by the even-numbered stages (the second stage in each successive pair of stages). Alternatively, the P register could be used by all stages, and the B register left unused in CRC mode. The working contents D31 to D0 in the RSD result register 62 are also used in feedback via a bus 63 leading back to the first combinatorial stage of the arithmetic circuit.

As before, because the CRC generation can use 32-bit, 16-bit or 8-bit generator polynomials (packed into the most significant end of the P and B registers if less than 32-bits), the combinatorial stages 65-1, 65-2, etc. include configuration multiplexers 69 and 70 for setting up operation with smaller generators, as seen in FIGS. 6 and 8. If an 8-bit generator is used, then multiplexers 70 supply the transferred bits from the A shift register 61 (respective bits A31 to A24, depending on the particular stage) to the XOR gates at the bit 24 location of each stage. If a 16-bit generator is used, then multiplexers 69 supply the transferred bits from the A register to the XOR gates at the bit 16 location of each stage. However, if a 32-bit generator is used, then the transferred bits from the A shift register 61 are supplied to the XOR gates corresponding to the bit 0 location. All other XOR gates receive previous stage XOR gate outputs, or feedback bits from result register RSD for the first stage XOR gates, of corresponding bit locations shifted by one, as seen in FIGS. 6 and 8. That is, the inter-stage connection for the XOR gates is shifted by one, as seen in FIGS. 6 and 8, so that XOR stage outputs T0 to T30 (and feedback bits D0 to D30) that correspond to bit locations 0 to 30 are supplied to the next stage (or first stage) XOR gates at respective bit locations 1 to 31. (Note: Since the result register contents are initially all zero, and any unused generator polynomial bits P0 to P15 and B0 to B15 for 16-bit generators, or P0 to P23 and B0 to B23 for 8-bit generators, are also all zero, the lower significance bit locations in those cases will remain zero throughout the operation.)

Because the RS operation only requires the first two stages 65-1 and 65-2 of the arithmetic circuit, and operates in the same manner as described above with reference to FIGS. 2-3, a multiplexer unit 71 is provided, as seen in FIG. 6, to select between a first bus 72 that receives the second stage results and a second bus 73 that receives the final (e.g., $4^{th}$ or $8^{th}$) stage results, and to supply that selection to a result bus 74 connected to the result register RSD.

The control of the CRC unit is done by four signals for setting the CRC16 and CRC8 multiplexers 69 and 70 in each stage, for setting multiplexer unit 71 for RS ($2^{nd}$ stage) or CRC ($4^{th}$ or $8^{th}$ stage) supply of operational results to the RSD result register 62, and for setting the shift clock counter (23 in FIG. 1, an equivalent clock counter, not shown, provides the clock signal in FIG. 6). The following table shows the settings of the different multiplexers for the different instructions:

| Instruction | CRC16 Mux 69 | CRC8 Mux 70 | Mux 71 |
|---|---|---|---|
| CRC8 | D/T | A | 4/8 |
| CRC16 | A | D/T | 4/8 |
| CRC32 | D/T | D/T | 4/8 |
| CRX8 | D/T | A | 4/8 |
| CRX16 | A | D/T | 4/8 |
| CRX32 | D/T | D/T | 4/8 |
| RSEAC | D/T | D/T | 2 |
| RSDAC | D/T | D/T | 2 |

Here D/T means that the multiplexer 69 or 70 passes the corresponding previous stage XOR output T or feedback bit D to the associated XOR input, A means that the multiplexer 69 or 70 passes the A register shift bit appropriate to that stage to the associated XOR input, 4/8 means that multiplexer 71 selects the output bits from bus 73 associated with the final ($4^{th}$ or $8^{th}$) stage to provide to the result register RSD, and 2 means that multiplexer 71 selects the output bits from bus 72 associated with the second stage to provide to the result register RSD.

The 4 bits/cycle shift clock is used in CRC mode when the arithmetic circuit implementation has 4 stages (2 pairs as in FIGS. 6 and 8, or 2 equivalent single-stage blocks of FIG. 9). The 8 bits/cycle shift clock is used in CRC mode when the arithmetic circuit implementation has 8 stages (4 pairs or its equivalent set of 4 single-stage blocks). The more stages the better, but the maximum operating clock rate gets lower with increasing number of stages. The RS circuitry still uses just one pair of stages with only one bit shifted from the A register per cycle. The shift clock signal needs to be clocked a different number of times (1, 2, 4 or 8) depending on the instruction. The table shows how many times should be clocked per instruction.

| Instruction | 8 bits/cycle shift clocks | 4 bits/cycle shift clocks |
|---|---|---|
| CRC8 | 4 | 8 |
| CRC16 | 4 | 8 |
| CRC32 | 4 | 8 |
| CRX8 | 1 | 2 |
| CRX16 | 1 | 2 |
| CRX32 | 1 | 2 |
| RSEAC | 8 (1 bit/cycle) | 8 (1 bit/cycle) |
| RSDAC | 8 (1 bit/cycle) | 8 (1 bit/cycle) |

In FIGS. 6 and 8, each stage of the circuit, whatever number of stages there may be, has a set of 32 AND gates 71 and a set of 32 XOR gates 73. A first input of each AND gate 71 is connected to receive a most significant intermediate result bit T31 from the previous stage or, for the first stage, D31 from the RSD result register 62. The other input of each AND gate 71 receives a corresponding generator bit P31 to P0 (or their copies B31 to B0). The AND gate output is supplied to a first input of its corresponding XOR gate 73. The other input to the XOR gates, except that of the XOR gate corresponding to the lowest used bit significance (bit 0 for 32-bit generators, bit 16 for 16-bit generators, and bit 24 for 8-bit generators), are connected to the XOR outputs of the preceding stage, or for the first stage to the feedback bus 63 from the RSD result register 62.

In FIG. 9, an alternative combinatorial circuit that can replace any or all pair of stages is shown, here represented by the second "pair" block 87-B corresponding to the block 67-B in FIG. 8. As before, the block receives an appropriate pair of bits shifted from the input shift register A, here represented by bits A29 and A28, receives the generator polynomial bits P31 to P0 (here register B is not needed, but could be used in a subsequent block), and receives intermediate result bits 0 to 31 from a preceding stage's output shifted by one bit position (or from feedback from the result register in the case of a first block). The block includes a set of 320 AND gates 91, organized as 10 AND gates per bit position, and a set of 32 XOR gates 93, receiving the AND gate outputs (some inverted) for its corresponding bit position. The connections provide the same exact Boolean logic as the two-stage version of FIG. 8, but are optimized according to known procedures to a single-stage two-level sum-of-products form. The reduction to a single stage comes at the expense of having AND gates with three or more inputs and XOR gates with 10 inputs, but may help meet timing requirements.

What is claimed is:

1. An error checking circuit, comprising:
   four input registers A, C, B and P for receiving and holding operands for finite-field arithmetic operations associated with Reed-Solomon (RS) and Cyclic Redundancy Check (CRC) codes;
   a result register RSD for holding and outputting a result of said finite-field arithmetic operations; and
   a combinatorial finite field arithmetic circuit connected to said registers and selectively configurable in response to program instructions to operate in any of a RS mode and a CRC mode, the arithmetic circuit configured in RS mode to carry out an iterated bitwise finite-field multiply-accumulate operation and configured in CRC mode to carry out an iterated finite-field polynomial modulo-division operation.

2. The circuit of claim 1 wherein two input registers A and C are shift registers providing shifted bits of said operands to said arithmetic circuit in response to a clock counter of said error checking circuit.

3. The circuit of claim 1 wherein a feedback bus connects the result register RSD to an input end of said arithmetic circuit.

4. The circuit of claim 1 wherein at least the input register P stores a selected generator polynomial associated with said RS and CRC codes.

5. The circuit of claim 1 wherein input register B stores a multiply coefficient in RS mode and a copy of a selected generator polynomial in CRC mode.

6. The circuit of claim 1 wherein each of the registers includes a register buffer in addition to a working register, data in each register buffer being transferable to the working register of a corresponding input register and data in the working register of said result register being transferable to the corresponding register buffer upon concluding one RS or CRC instruction and beginning another.

7. The circuit of claim 1 wherein each of two input registers A and C are connected to a corresponding multiplexer responsive to respective RS encode and RS decode instructions for broadcasting a least significant byte of said respective A and C registers into all other bytes of that register.

8. The circuit of claim 1 wherein the registers also have swap means for selectively swapping bytes or bits of data when loading or unloading data in said registers in accord with a selected CRC standard.

9. The circuit of claim 1 wherein said arithmetic circuit comprises a pair of combinatorial stages, with each stage having a set of AND gates and a set of XOR gates with associated bit locations, with the output of the AND gates connected to one input of associated XOR gates, the output of the XOR gates in the first stage connected to the second stage of the arithmetic circuit via a configuration unit responsive to RS and CRC instructions for setting said RS or CRC mode, the result register connected via a feedback bus to the first combinatorial stage of the arithmetic circuit via a second configuration unit also responsive to RS and CRC instruction for setting said RS or CRC mode, whereby the combinatorial gate connections differ in the RS and CRC modes of operation.

10. The circuit of claim 1 wherein said arithmetic circuit has multiplexer means responsive to CRC instructions indicative of generator polynomial size for supplying A register shift bits to combinatorial elements within the arithmetic circuit that are associated with a bit location associated with the indicated generator size.

11. The circuit of claim 1 wherein said arithmetic circuit has a plurality of pairs of combinatorial stages, each stage having a set of AND gates and a set of XOR gates with outputs of the AND gates being connected to one input of a corresponding XOR gate and with outputs of the XOR gates in one stage being generally connected to a second input of a corresponding XOR gate of a subsequent stage, except that outputs of the XOR gates in a final stage are supplied to a result register and second inputs of the XOR gates in the first stage are connected to receive feedback bits from the result register, the arithmetic circuit having RS/CRC configuration multiplexers wherein interstage connections go to gates at corresponding bit locations in the RS mode but go to gates at corresponding bit locations shifted by one in the CRC mode, and wherein the XOR gate outputs of the second stage connect to the result register in RS mode.

* * * * *

UNITED STATES PATENT AND TRADEMARK OFFICE
CERTIFICATE OF CORRECTION

| | |
|---|---|
| PATENT NO. | : 6,836,869 B1 |
| APPLICATION NO. | : 10/061500 |
| DATED | : December 28, 2004 |
| INVENTOR(S) | : David C. Wyland |

Page 1 of 1

It is certified that error appears in the above-identified patent and that said Letters Patent is hereby corrected as shown below:

On the Title Page at Item (73) Assignee reads "Cradle Technologies, Inc.", should read -- Cradle Technologies --.

Signed and Sealed this

Nineteenth Day of May, 2009

JOHN DOLL
*Acting Director of the United States Patent and Trademark Office*